US012137541B2

(12) United States Patent
Killen, Jr. et al.

(10) Patent No.: US 12,137,541 B2
(45) Date of Patent: Nov. 5, 2024

(54) ENHANCED FAN INTEGRATION IN DATA STORAGE SYSTEMS

(71) Applicant: SANMINA CORPORATION, San Jose, CA (US)

(72) Inventors: Odie Banks Killen, Jr., Colorado Springs, CO (US); John Albert Bauer, Jr., Colorado Springs, CO (US); Daniel Joseph Gregory, Colorado Springs, CO (US); Charles Christoper Hill, Colorado Springs, CO (US); Xin Wang, Katy, TX (US); Kenneth Dale Van Antwerp, Jr., Colorado Springs, CO (US)

(73) Assignee: Sanmina Corporation, San Jose, CA (US)

( * ) Notice: Subject to any disclaimer, the term of this patent is extended or adjusted under 35 U.S.C. 154(b) by 195 days.

(21) Appl. No.: 17/980,351

(22) Filed: Nov. 3, 2022

(65) Prior Publication Data

US 2024/0155814 A1    May 9, 2024

(51) Int. Cl.
*H05K 7/20* (2006.01)
*G11B 33/14* (2006.01)
*H05K 7/14* (2006.01)
*H05K 9/00* (2006.01)

(52) U.S. Cl.
CPC ....... *H05K 7/20727* (2013.01); *G11B 33/142* (2013.01); *H05K 7/1495* (2013.01); *H05K 7/20136* (2013.01); *H05K 9/0062* (2013.01)

(58) Field of Classification Search
None
See application file for complete search history.

(56) References Cited

U.S. PATENT DOCUMENTS

| 4,926,291 | A  | * | 5/1990 | Sarraf | G11B 33/1493 |
| | | | | | 361/728 |
| 7,636,237 | B2 | * | 12/2009 | Cheung | G11B 33/122 |
| | | | | | 361/679.37 |
| 8,830,673 | B2 | * | 9/2014 | Kuo | G06F 1/20 |
| | | | | | 361/679.48 |
| 9,025,326 | B1 | | 5/2015 | Xu | |
| 2005/0254210 | A1 | | 11/2005 | Grady et al. | |
| 2006/0056150 | A1 | | 3/2006 | Behl et al. | |
| 2009/0273896 | A1 | | 11/2009 | Walker et al. | |
| 2015/0083676 | A1 | | 3/2015 | Peng et al. | |
| 2015/0173231 | A1 | | 6/2015 | Rado et al. | |
| 2016/0209891 | A1 | | 7/2016 | Peng et al. | |
| 2016/0270250 | A1 | | 9/2016 | Chen et al. | |
| 2022/0104383 | A1 | | 3/2022 | Choyikkunnil et al. | |

OTHER PUBLICATIONS

PCT/US2023/035860. International Search Report & Written Opinion (Dec. 26, 2023).

* cited by examiner

*Primary Examiner* — Robert J Hoffberg
(74) *Attorney, Agent, or Firm* — Julio Loza; LOZA & LOZA, LLP

(57) ABSTRACT

Data storage systems may include a chassis with a first end and a second end. One or more fans may be positioned at the first end of the chassis. At least one storage media device may be positioned inside the chassis and behind the at least one fan relative to the first end of the chassis. A carrier including a frame may be coupled to the at least one storage media device, where the frame includes an elongated member extending away from the storage media device toward the first end of the chassis. Other aspects, embodiments, and features are also included.

13 Claims, 6 Drawing Sheets

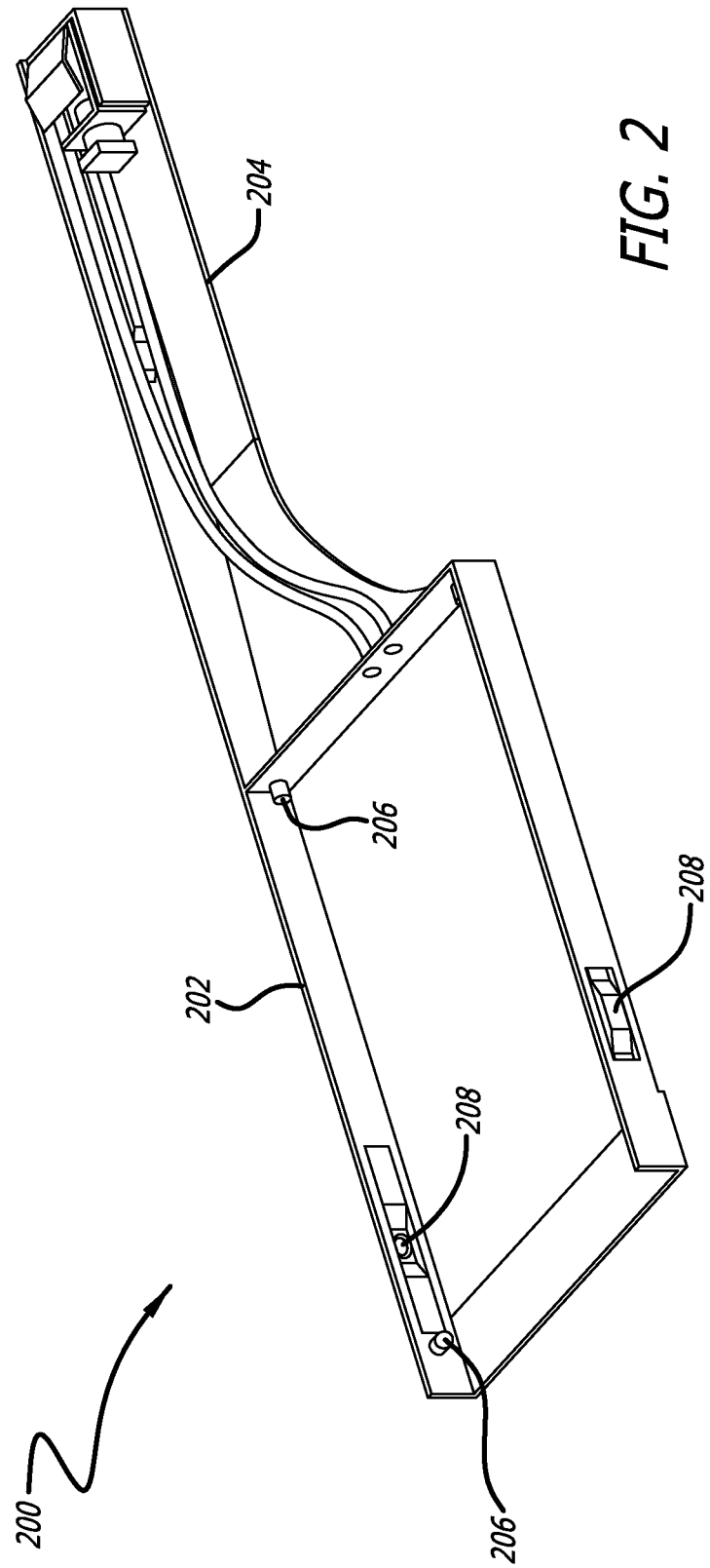

ENHANCED FAN INTEGRATION IN DATA STORAGE SYSTEMS

TECHNICAL FIELD

The technology discussed below relates generally to data storage systems, and more specifically to ventilation fan integration in data storage systems.

BACKGROUND

Computer and network systems such as data storage systems (e.g., server systems, cloud storage systems, just a bunch of drives/disks (JBOD), just a bunch of flash (JBOF), personal computers, and workstations) typically include data storage devices for storing and retrieving data. These data storage devices can include hard disk drives (HDDs), solid state drives (SSDs), etc., that include both rotating and solid state data storage elements.

As computer systems and networks grow in numbers and capability, there is a need for ever increasing storage capacity. Data centers, cloud computing facilities, and other at-scale data processing systems have further increased the need for digital data storage systems capable of transferring and holding immense amounts of data. Data centers can house large quantities of data storage systems stored in various rack-mounted and high-density storage configurations.

While densities and workloads for the data storage systems increase, individual data storage devices can experience increased failure rates due to the increased densities and higher operating temperatures. Features and systems that can improve the operation and function of data storage systems are generally desirable.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Various examples and implementations of the present disclosure relate to ventilation fan integration in data storage systems. According to at least one aspect, data storage systems are provided. According to one or more embodiments, a data storage system may include a chassis including a first end and a second end. At least one fan may be positioned at the first end of the chassis. At least one storage media device may be positioned inside the chassis behind the at least one fan relative to the first end of the chassis. A carrier including a frame may be coupled to the at least one storage media device. The frame may include an elongated member extending away from the storage media device toward the first end of the chassis.

Additional aspects of the present disclosure include data storage assemblies. According to one or more embodiments, a data storage assembly may include at least one storage media device, and a carrier including a frame coupled to the at least one storage media device. The frame may include an elongated member extending away from the at least one storage media device. In some embodiments, a fan may be positioned adjacent to a portion of the elongated member of the frame.

Additional aspects of the present disclosure include methods of making a data storage system. According to at least one implementation, such methods may include coupling a storage media device to a carrier, where the carrier includes a frame with an elongated member extending away from the storage media device. The carrier, together with the coupled storage media device may be disposed in a chassis. A fan may be positioned at an end of the chassis with the storage media device positioned behind the fan relative to the end of the chassis.

Other aspects, features, and embodiments associated with the present disclosure will become apparent to those of ordinary skill in the art upon reviewing the following description in conjunction with the accompanying figures.

DRAWINGS

FIG. 2 is an isometric view of a carrier according to at least one embodiment.

DETAILED DESCRIPTION

The description set forth below in connection with the appended drawings is intended as a description of various configurations and is not intended to represent the only configurations in which the concepts and features described herein may be practiced. The following description includes specific details for the purpose of providing a thorough understanding of various concepts. However, it will be apparent to those skilled in the art that these concepts may be practiced without these specific details. In some instances, well known circuits, structures, techniques and components are shown in block diagram form to avoid obscuring the described concepts and features.

The illustrations presented herein are, in some instances, not actual views of any particular data storage system, data storage assembly, storage media device, carrier, or other specific components of a data storage system, but are merely representations which are employed to describe the present disclosure. Additionally, elements common between figures may retain the same numerical designation.

Figure 1:
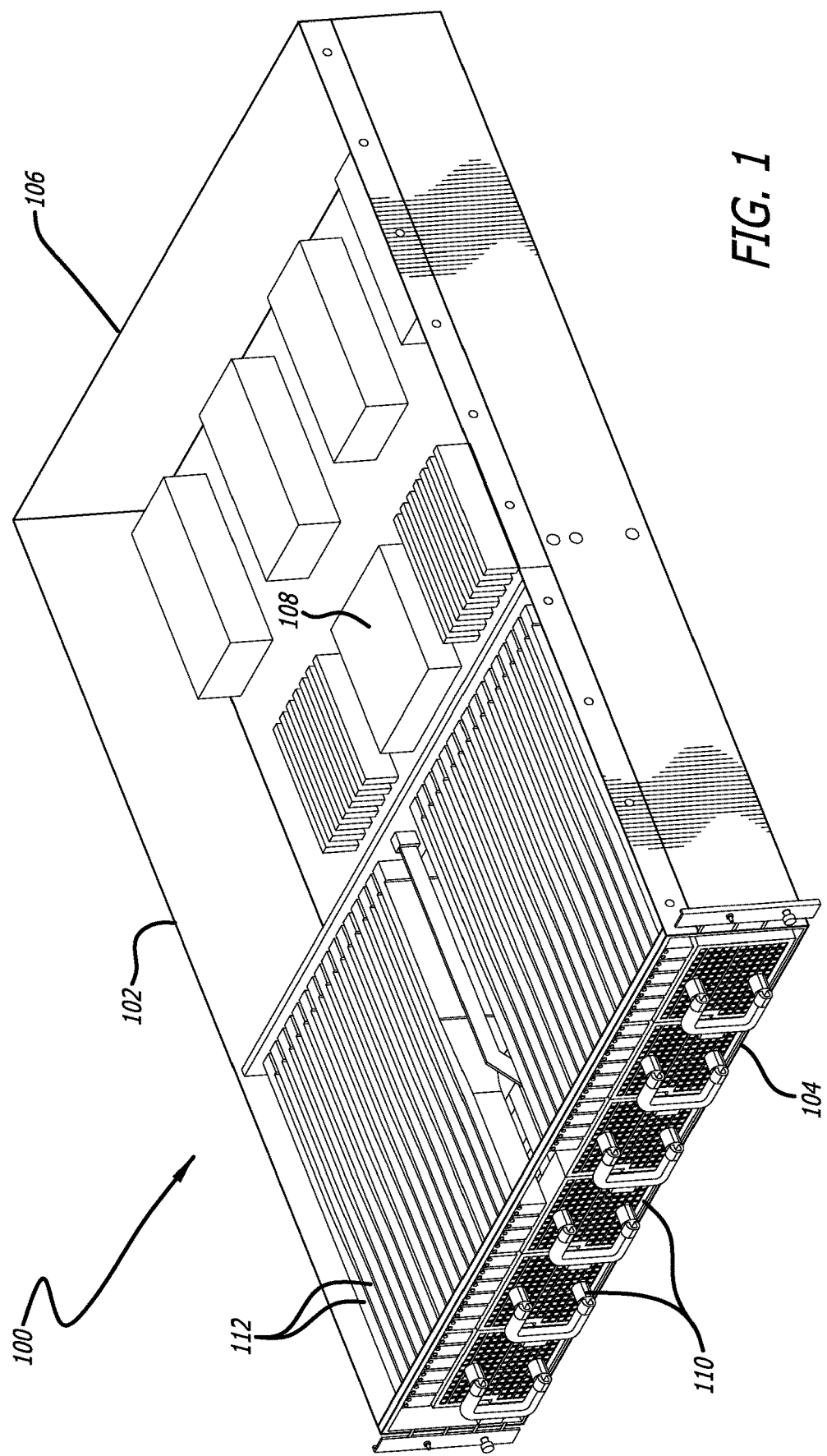
FIG. 1 is an isometric view of a data storage system according to at least one embodiment configured as a server module.

Aspects of the present disclosure relate to data storage systems, such as server modules, JBOD (Just a Bunch Of Drives) and JBOF (Just a Bunch Of Flash), by way of example. Example data storage systems may be configured for storage in various rack-mounted and high-density storage configurations. Example data storage systems may include many storage media devices with conventional I/O modules to facilitate a JBOD/JBOF configuration. Referring to FIG. 1, an isometric view of a data storage system 100 is depicted according to at least one embodiment of a data storage system 100 configured as a server module. The data storage system 100 may include a chassis 102, which provides a housing or enclosure for various components. The chassis 102 includes a first end 104 and an opposing second end 106. In the image, a top cover of the chassis 102 is removed to show an example of the internal components of the server module according to at least one example. Within portions of the chassis, the data storage system 100 includes various components. In the depicted example of a data storage system 100 configured as a server module, the data storage system 100 may include a controller, including a central processing unit (CPU) 108. The data storage system 100 also includes one or more fans 110, and one or more storage media devices 112. It should be understood that the example in FIG. 1 depicting the data storage system 100 as a server module is just for illustration and explanation purposes, and that the data storage system 100 may also be configured as other types of data storage systems. For example, the data storage system 100 may be configured as a JBOD, a JBOF, or any other known or suitable configuration of a data storage system.

The one or more fans 110 may be positioned at the first end 104 of the chassis 102. The one or more fans 110 may each include a motor and fan blades to force air in a particular direction, such as into or out from the chassis 102. Such fans 110 can facilitate cooling of the internal components of the data storage system 100.

The one or more storage media devices 112 are positioned in the chassis 102 behind the one or more fans 110. For example, the one or more fans 110 may be positioned so that a surface of the fan is positioned at about the first end 104 of the chassis 102, while the rest of the fan 110 is inside the chassis 102. Behind the fan 110, meaning further inside the chassis 102 from the first end 104 than the fan 110, the one or more storage media devices 112 can be positioned. The storage media devices 112 may be any known storage media device, including a hard disk drive (HDD), a solid state drive (SSD), etc.

According to various aspects, each storage media device 112 can be coupled to a respective carrier. For example, FIG. 2 is an isometric view of a carrier 200 according to at least one example. The carrier 200 may include a frame 202 that couples to a storage media device 112, where the frame 202 includes an elongated member 204. The carrier may be formed from a polymer material, a metal, or some combination thereof.

In some examples, the carrier 200 may include one or more protrusions 206 configured to fit into corresponding apertures in a storage media device 112 to aid in keeping the storage media device 112 coupled to the frame 202. In at least some examples, such as the example shown, a protrusion 206 may be formed integral to the frame 202.

In some examples, the carrier 200 may include one or more retention features 208 to aid in keeping the carrier 200 positioned in, or coupled to the chassis 102. By way of example, a retention feature 208 may be a latch, a spring-aided protrusion, or other feature(s) capable of retaining the carrier 200 in the chassis 102 while still enabling each carrier 200 to be removed from the chassis 102 when desired.

Figure 3A:
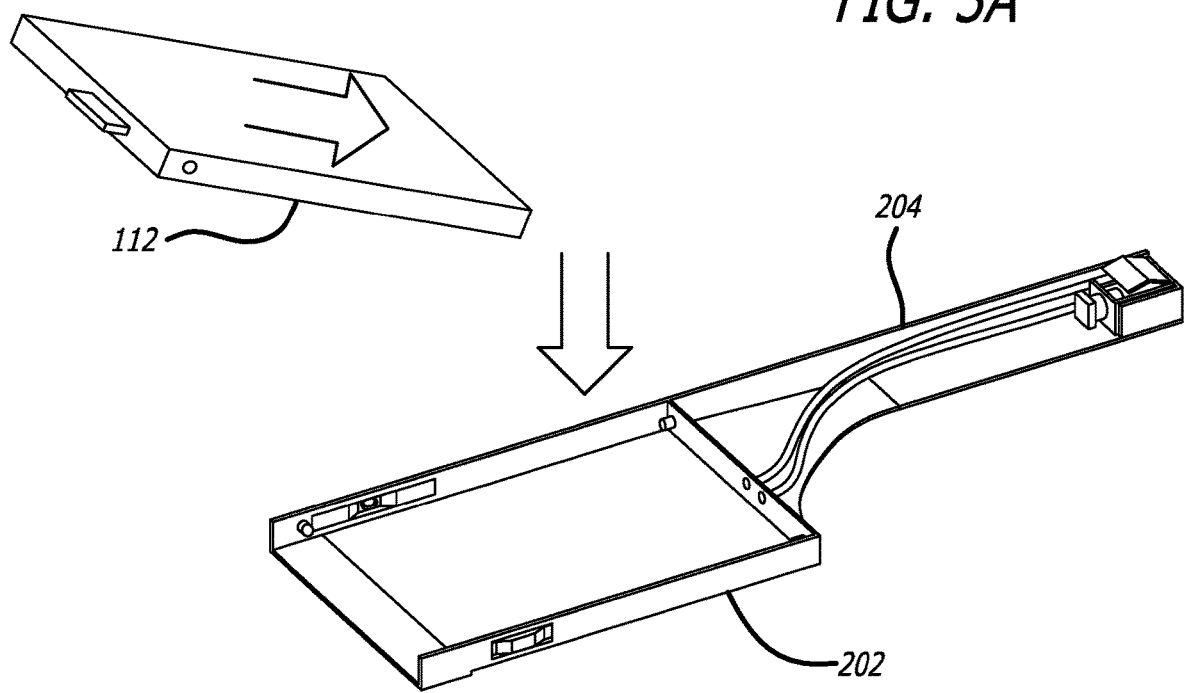
FIG. 3A is an isometric view depicting the coupling of a storage media device to a carrier according to at least one embodiment.
Figure 3B:
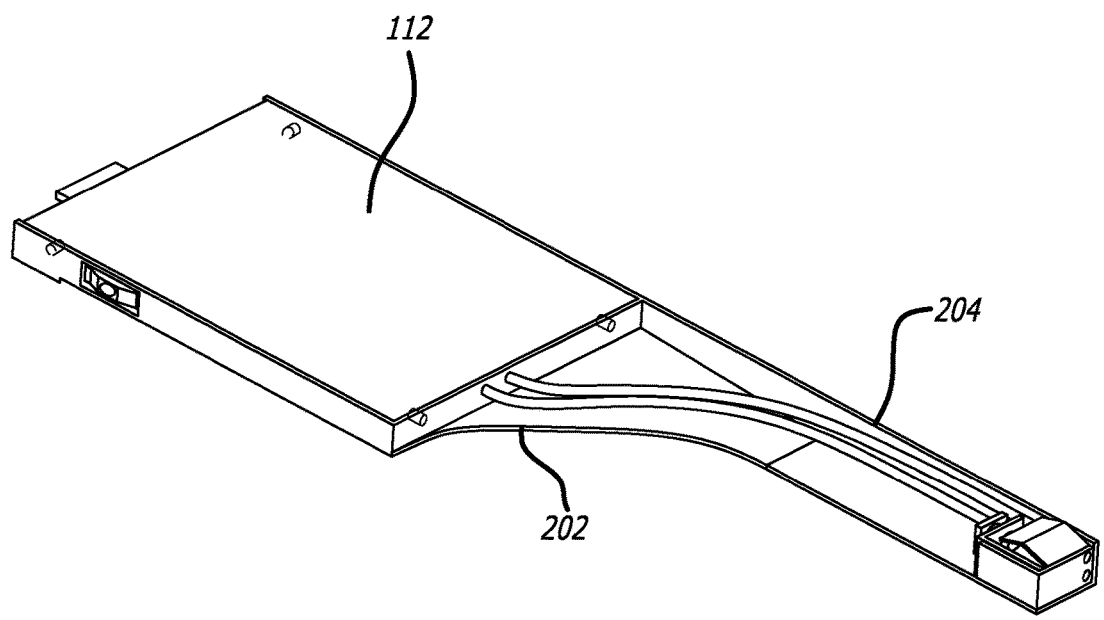
FIG. 3B is an isometric view depicting the coupling of a storage media device to a carrier according to at least one embodiment.

FIG. 3, consisting of FIGS. 3A and 3B, shows isometric views illustrating a storage media device 112 being coupled to a frame 202 of the carrier 200 according to at least one example. As shown, a storage media device 112 can be positioned into a portion of the frame 202, and coupled to the frame 202 such that the storage media device 112 can also be removed from the frame 202 if desired. In the depicted example, the storage media device 112 is coupled to the frame 202 with the elongated member 204 extending away from the storage media device 112.

Figure 4:
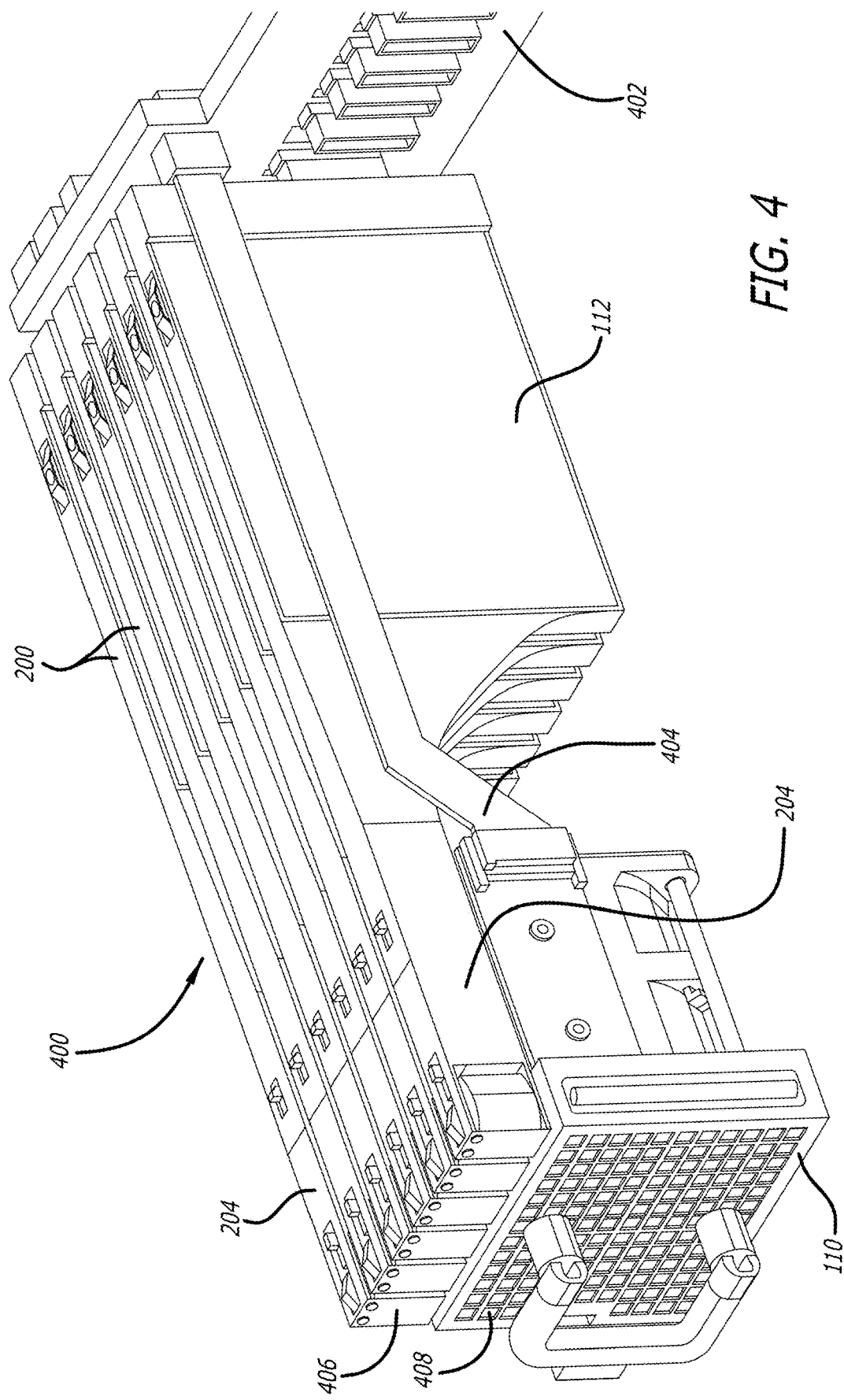
FIG. 4 is an isometric view of a data storage assembly employed in a data storage system according to at least one embodiment.

According to aspects of the disclosure, multiple carriers 200 with respectively coupled storage media devices 112 may be positioned behind a fan 110. For example, FIG. 4 is an isometric view of a data storage assembly according to at least one example. As shown, the data storage assembly 400 may include a fan 110 and a plurality of carriers 200 each coupled with a respective storage media device 112 positioned behind the fan 110. As shown, the elongated member 204 of each frame 202 is positioned to extend over a side of the fan 110. In the depicted example, the elongated member 204 of each frame 202 extends over the top side or surface of the fan 110 as oriented in the image, but it should be apparent that the orientation could change so that the elongated members 204 extend over a left side, right side, or the bottom side of the fan 110 in other embodiments.

As shown in FIG. 4, the fan 110 can be electrically coupled to a midplane 402 by an electrical pathway 404 to convey power and control signals to the fan 110. The midplane 402 may provide power and signal interconnects between one or more components at or near the first end 104 of the chassis 102 and one or more components at or near the second end 106 of the chassis 102. For instance, in the example depicted in FIG. 1, the midplane 402 can provide power and signal interconnects between the fan 110 and/or storage media device 112 and the CPU 108. The electrical pathway 404 may be a cable, a printed circuit board (PCB), and/or other suitable path for conveying electrical signals.

In some embodiments, the fan 110 and a portion of the carrier 200 can form an electromagnetic interference (EMI) containment surface at the first end 104 of the chassis 102. For example, the elongated member 204 can extend over a side surface of the fan 110 with an end surface 406 of the elongated member 204 positioned coplanar, or at least substantially coplanar to a front surface 408 of the fan 110, which may be configured to form a front face and EMI containment for the chassis 102.

With the storage media devices 112 positioned behind the fans 110 in the chassis 102, a fan 110 can be easily removed and replaced without temporarily taking the data storage system 100 offline. Additionally, the data storage system 100 can utilize larger fans 110 capable of driving more air at lower speeds, which can improve both the cooling efficiency of each fan 110 as well as the life of each fan 110. Utilizing larger fans 110 can also reduce the total power used for cooling the data storage system 100, thereby improving the total cost of ownership (TCO) for the data storage system. Additionally, larger fans 110 can improve pressure, resulting in improved thermal performance in relatively restrictive environments.

Figure 5:
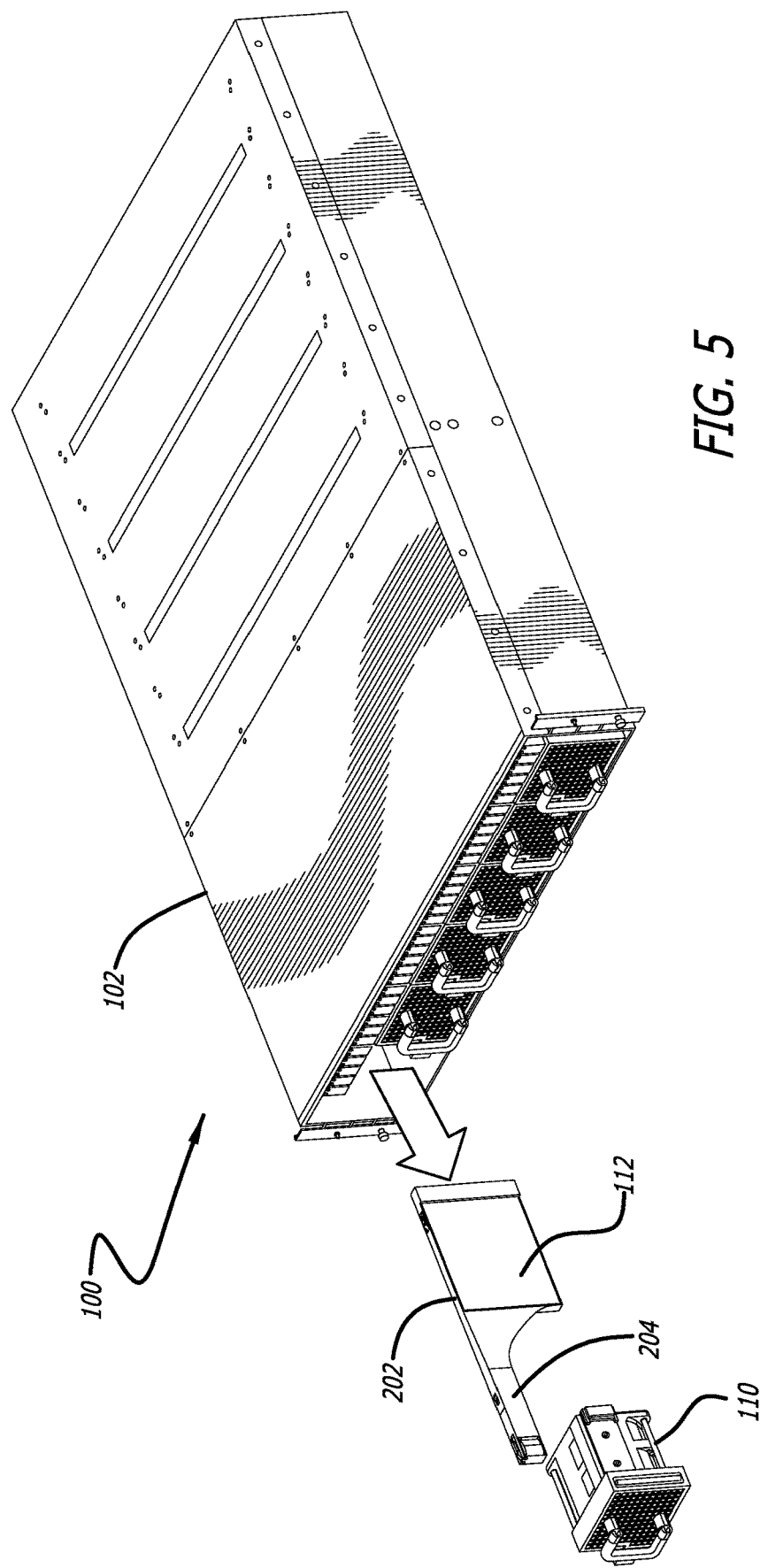
FIG. 5 is an isometric view of the data storage system of FIG. 1 depicting removal of a fan and a storage media device according to at least one embodiment.

Referring now to FIG. 5, an isometric view of the data storage system 100 is shown according to one example illustrating the removal of both a fan 110 and a carrier 200. Each fan 110 can be removed independent of any carrier 200 or storage media device 112. As noted above, a fan 110 can simply be pulled out of the chassis 102 for maintenance or replacement. Further, to access a storage media device 112, a fan 110 can first be pulled out from the chassis 102, and the desired storage media device 112 can be removed from the chassis 102 by grasping the elongated member 204 of the frame 202 and pulling the frame 202 with the storage media device 112 out from the chassis 102. The elongated member 204 can therefore operate as a handle feature at the front face of the chassis 102 for removing a storage media device 112.

Figure 6:
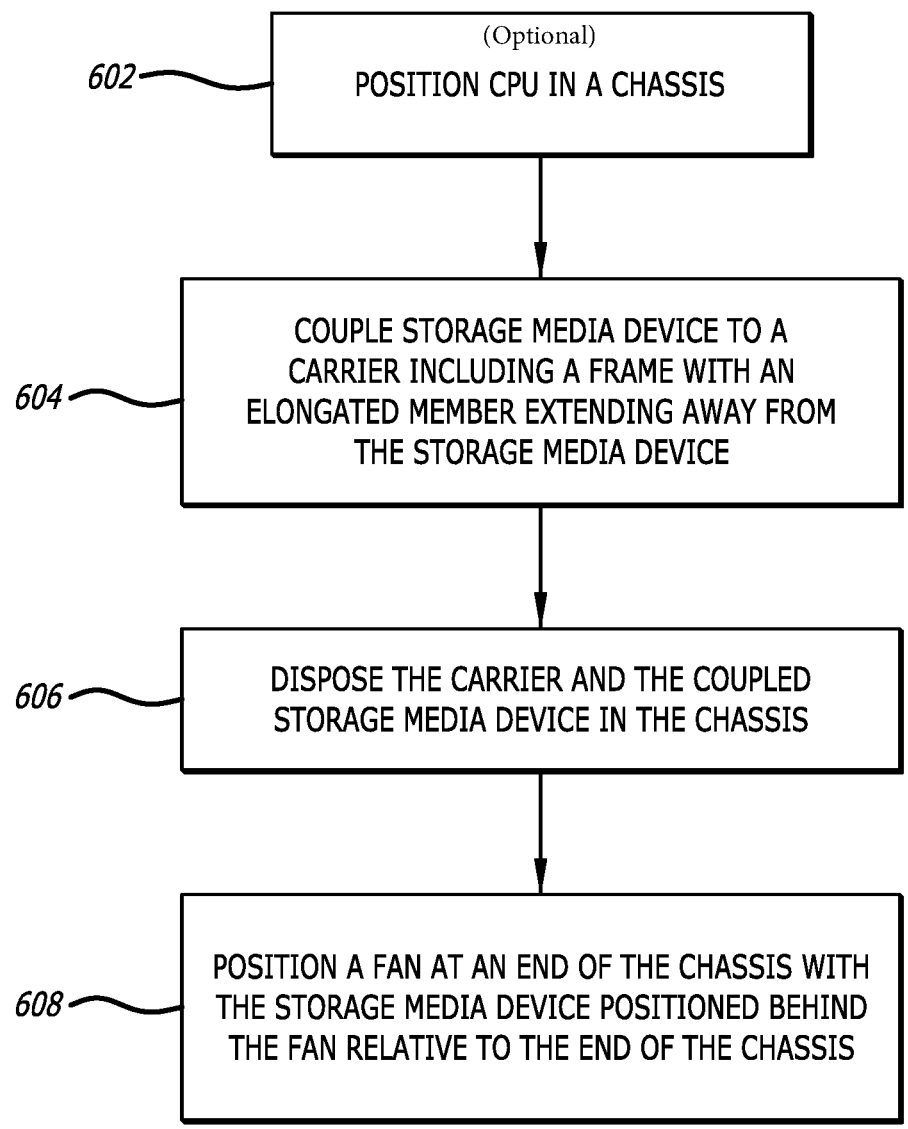
FIG. 6 is a flow diagram illustrating at least one implementation of a method for making a data storage system.

Additional aspects of the present disclosure include methods of making a data storage system, such as the data storage system 100. FIG. 6 is a flow diagram depicting at least one example of a method of making a data storage system. With reference to FIGS. 1-6, the method may include an optional step 602 in one or more implementation in which a CPU 108 may be positioned within a chassis 102 at operation. The CPU 108 may be any conventional CPU, which are consistently being improved and upgraded in design and operation. Accordingly, any sufficient CPU for a user's purposes can be positioned in the chassis 102.

At 604, a storage media device 112 may be coupled to a carrier 200. As set forth herein, the carrier 200 can include a frame 202 with an elongated member 204 extending away from the coupled storage media device 112. In some implementations, the storage media device 112 may be coupled to the carrier 200 utilizing one or more protrusions 206 in the frame 202. For example, at least one aperture in the storage media device 112 may be coupled to a respective protrusion 206 of the frame 202. As also noted herein, the storage media device 112 coupled to the carrier 200 may be a SSD or a HDD.

At 606, the carrier 200 and the coupled storage media device 112 may be disposed in the chassis 102. In some examples, the storage media device 112 can be coupled to a midplane 402 when the carrier 200 and storage media device 112 are disposed in the chassis 102. In some examples, the carrier 200 includes one or more retention features 208 to aid in removably coupling the carrier 200 to the chassis 102.

According to one or more examples, an end surface 406 of the elongated member 204 may be positioned at the first end 104 of the chassis 102, and may form a part of an EMI containment surface at the first end 104 of the chassis 102. As noted herein, the end surface 406 of the elongated member 204 together with the fan 110 can form an EMI containment surface at the first end 104 of the chassis 102.

At 608, a fan 110 can be positioned at the first end 104 of the chassis 102 with the storage media device 112 positioned behind the fan 110 relative to the first end 104 of the chassis 102. As a result, from the first end 104 of the chassis 102, the storage media device 112 is nested behind the fan 110 in the chassis 102. The fan 110 can be positioned with a side surface of the fan adjacent to a portion of the elongated member 204 of the frame 202.

While the above discussed aspects, arrangements, and embodiments are discussed with specific details and particularity, one or more of the components, steps, features and/or functions illustrated in FIGS. 1, 2, 3, 4, 5, and/or 6 may be rearranged and/or combined into a single component, step, feature or function or embodied in several components, steps, or functions. Additional elements, components, steps, and/or functions may also be added or not utilized without departing from the present disclosure. The apparatus, devices and/or components illustrated in FIGS. 1, 2, 3, 4, and/or 5 may be configured to perform or employ one or more of the methods, features, parameters, and/or steps described in FIG. 6.

While features of the present disclosure may have been discussed relative to certain embodiments and figures, all embodiments of the present disclosure can include one or more of the advantageous features discussed herein. In other words, while one or more embodiments may have been discussed as having certain advantageous features, one or more of such features may also be used in accordance with any of the various embodiments discussed herein. In similar fashion, while exemplary embodiments may have been discussed herein as device, system, or method embodiments, it should be understood that such exemplary embodiments can be implemented in various devices, systems, and methods.

Also, it is noted that at least some implementations have been described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features associated with the examples described herein and shown in the accompanying drawings can be implemented in different examples and implementations without departing from the scope of the present disclosure. Therefore, although certain specific constructions and arrangements have been described and shown in the accompanying drawings, such embodiments are merely illustrative and not restrictive of the scope of the disclosure, since various other additions and modifications to, and deletions from, the described embodiments will be apparent to one of ordinary skill in the art. Thus, the scope of the disclosure is only determined by the literal language, and legal equivalents, of the claims which follow.

What is claimed is:

1. A data storage assembly, comprising:
at least one storage media device;
a carrier comprising a frame coupled to the at least one storage media device, wherein the frame includes an elongated member extending away from the at least one storage media device; and
a fan positioned adjacent to a portion of the elongated member of the frame, wherein a portion of the elongated member extends over a side surface of the fan with an end surface of the elongated member positioned at least substantially coplanar to a front surface of the fan, and wherein the front surface of the fan and the end surface of the elongated member form an electromagnetic interference (EMI) containment surface.

2. The data storage assembly of claim 1, wherein the at least one storage media device comprises a solid state drive (SSD) or a hard disk drive (HDD).

3. The data storage assembly of claim 1, wherein the frame includes a plurality of protrusions positioned in respective apertures of a respective one of the at least one storage media device.

4. The data storage assembly of claim 1, wherein the frame includes one or more retention features to couple the frame to a chassis.

5. A data storage system, comprising:
a chassis including a first end and a second end;
at least one fan positioned at the first end of the chassis;
at least one storage media device positioned inside the chassis and behind the at least one fan relative to the first end of the chassis; and
a carrier including a frame coupled to the at least one storage media device, wherein the frame includes an elongated member, which elongated member extends away from the at least one storage media device toward the first end of the chassis and adjacent to a side surface of the at least one fan,
wherein a front surface of the at least one fan and a portion of the elongated member are at least substantially coplanar and form an electromagnetic interference (EMI) containment surface at the first end of the chassis.

6. The data storage system of claim 5, wherein the at least one storage media device comprises a solid state drive (SSD) or a hard disk drive (HDD).

7. The data storage system of claim 5, wherein the at least one storage media device comprises a plurality of storage media devices positioned inside the chassis and behind the at least one fan relative to the first end of the chassis forming a just a bunch of drives (JBOD) or a just a bunch of flash (JBOF).

8. The data storage system of claim 5, further comprising a controller including a central processing unit (CPU) positioned within the chassis.

9. The data storage system of claim 8, further comprising a midplane positioned in the chassis, wherein the CPU, the at least one fan and the at least one storage media device are electrically coupled to the midplane.

10. A method of making a data storage system, the method comprising:
coupling a storage media device to a carrier, the carrier including a frame with an elongated member extending away from the storage media device;
disposing the carrier with the coupled storage media device in a chassis with an end surface of the elongated member at an end of the chassis; and
positioning a fan at the end of the chassis with the storage media device positioned behind the fan relative to the end of the chassis, and with a side surface of the fan adjacent to a portion of the elongated member, wherein a front surface of the fan is at least substantially coplanar with the end surface of the elongated member to form an electromagnetic interference (EMI) containment surface at the end of the chassis.

11. The method of claim 10, wherein disposing the carrier with the coupled storage media device in the chassis comprises:
coupling the storage media device to a midplane.

12. The method of claim 10, wherein coupling the storage media device to the carrier comprises:
coupling at least one aperture in the storage media device to a respective protrusion of the frame of the carrier.

13. The method of claim 10, wherein coupling the storage media device to the carrier comprises:
coupling a solid state drive (SSD) or a hard disk drive (HDD) to the carrier.

* * * * *